United States Patent
Paek et al.

(10) Patent No.: US 8,618,658 B1
(45) Date of Patent: Dec. 31, 2013

(54) SEMICONDUCTOR DEVICE AND FABRICATING METHOD THEREOF

(75) Inventors: Jong Sik Paek, Kyunggi-do (KR); Won Chul Do, Seoul (KR); Eun Sook Sohn, Seoul (KR)

(73) Assignee: Amkor Technology, Inc.

( * ) Notice: Subject to any disclaimer, the term of this patent is extended or adjusted under 35 U.S.C. 154(b) by 859 days.

(21) Appl. No.: 12/727,608

(22) Filed: Mar. 19, 2010

(51) Int. Cl.
*H01L 21/283* (2006.01)

(52) U.S. Cl.
USPC .... 257/737; 257/738; 257/778; 257/E21.159; 257/E23.021

(58) Field of Classification Search
USPC ............ 257/737, 738, 778, E23.021, E2.159
See application file for complete search history.

(56) References Cited

U.S. PATENT DOCUMENTS

| | | | |
|---|---|---|---|
| 6,433,427 B1 * | 8/2002 | Wu et al. ...................... | 257/737 |
| 6,455,408 B1 | 9/2002 | Hwang et al. | |
| 7,183,645 B2 | 2/2007 | Kurosawa et al. | |
| 2006/0038291 A1 | 2/2006 | Chung et al. | |
| 2007/0252275 A1 | 11/2007 | Huang et al. | |
| 2009/0166859 A1 | 7/2009 | Yuan et al. | |

OTHER PUBLICATIONS

Jin et al., "Semiconductor Device and Manufacturing Method Thereof", U.S. Appl. No. 12/116,695, filed May 7, 2008.

* cited by examiner

*Primary Examiner* — Roy Potter
(74) *Attorney, Agent, or Firm* — McAndrews, Held & Malloy, Ltd.

(57) ABSTRACT

A semiconductor device and a fabrication method thereof are provided. An electrically conductive elastic member is formed on a semiconductor die, and a conductive bump is formed on the elastic member. Accordingly, since the conductive bump is formed on the elastic member, or to protrude from a top surface of the elastic member, the height and thus diameter of the conductive bump is reduced allowing a fine pitch to be realized. Further, the elastic member is elastic and thus mitigates external impacts from being transferred from the conductive bump to the semiconductor die.

13 Claims, 8 Drawing Sheets

SEMICONDUCTOR DEVICE AND FABRICATING METHOD THEREOF

BACKGROUND OF THE INVENTION

1. Field of the Invention

The present invention relates generally to a semiconductor device and a fabricating method thereof.

2. Description of the Related Art

Recently, with the increasing demand for having a larger-capacity, higher-performance semiconductor device, multiple input/output terminals are required for constituting a semiconductor device. Furthermore, due to the trend towards smaller semiconductor devices in size, as well as the formation of multiple input/output terminals, there is a limit on the spacing density of the input/output terminals.

To address this problem, a wafer level package (WLP) structure in which conductive bumps are directly formed on top surfaces of semiconductor dies has been developed. However, the developed WLP structure suffers from the complexity in controlling the number and pitch spacing of conductive bumps due to presence of the conductive bumps, which are made of a solder material, making the WLP structure bulky. Therefore, the conventional WLP structure is not suitable for achieving fine pitch conductive bumps.

BRIEF SUMMARY OF THE INVENTION

A semiconductor device and a fabrication method thereof are provided. An electrically conductive elastic member is formed on a semiconductor die, and a conductive bump is formed on the elastic member. Accordingly, since the conductive bump is formed on the elastic member, or to protrude from a top surface of the elastic member, the height and thus diameter of the conductive bump is reduced allowing a fine pitch to be realized. Further, the elastic member is elastic and thus mitigates external impacts from being transferred from the conductive bump to the semiconductor die.

The present invention will be more apparent from the following detailed description taken in conjunction with the accompanying drawings.

BRIEF DESCRIPTION OF THE DRAWINGS

Common reference numerals are used throughout the drawings and the detailed description to indicate the same elements.

DETAILED DESCRIPTION OF THE INVENTION

Figure 1:
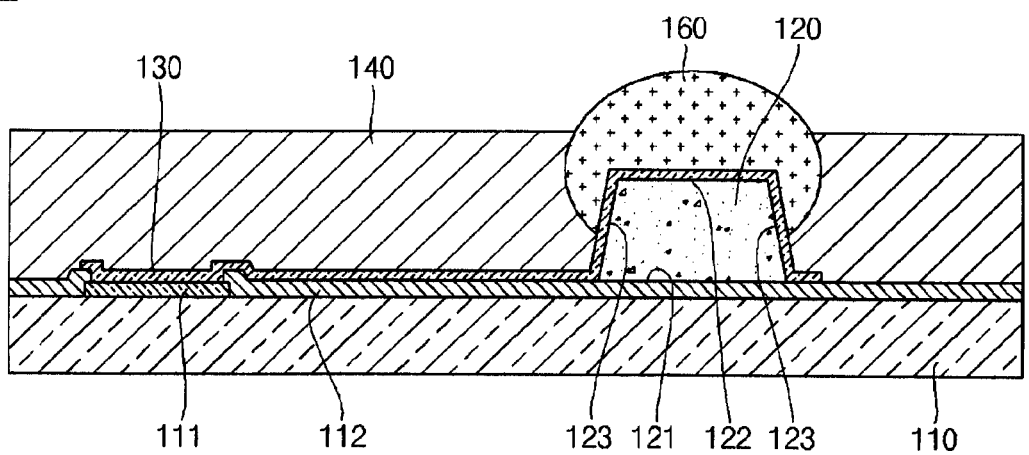
FIG. 1 is a sectional view illustrating a semiconductor device according to an embodiment of the present invention.

Referring to FIG. 1, a sectional view of a semiconductor device 100 according to an embodiment of the present invention is illustrated.

As illustrated in FIG. 1, the semiconductor device 100 according to an embodiment of the present invention includes a semiconductor die 110, an elastic member 120 formed on the semiconductor die 110, a redistribution layer 130 formed to surround the outer periphery of the elastic member 120, an insulating passivation layer 140 formed on the redistribution layer 130, and a conductive bump 160 formed on the insulating passivation layer 140 to be exposed to an upper portion of the insulating passivation layer 140.

The semiconductor die 110 includes a plurality of bond pads 111 on its one surface, sometimes called a first or active surface. The semiconductor die 110 inputs/outputs an electrical signal from/to an external circuit through each of the plurality of bond pads 111. In addition, the semiconductor die 110 further includes a passivation layer 112 formed on peripheral areas of the bond pad 111 and the active surface of the semiconductor die 110 while exposing the central portions of the bond pads 111 through openings in the passivation layer 112. The passivation layer 112, sometimes called a first passivation layer, protects the semiconductor die 110 from external impacts, and is made of an insulating material. Further, the passivation layer 112 is provided for electrically insulating the rest of the areas, excluding the bond pad 111, of the semiconductor die 110.

The elastic member 120 is formed on the active surface of the semiconductor die 110. The elastic member 120 includes a bottom surface 121 on the passivation layer 112, a top surface 122 spaced above the passivation layer 112, and a sidewall surface 123 extending between the bottom surface 121 and the top surface 122. The bottom surface 121 and the top surface 122 are generally planar (flat) surfaces parallel to the active surface of the semiconductor die 110. The sidewall surface 123 tapers upwards such that area of the top surface 122 is less than the area of the bottom surface 121 although can be equal or greater in area in other examples.

The elastic member 120 protrudes from an upper portion of the semiconductor die 110. The elastic member 120 may be spaced apart from the bond pad 111. On the elastic member 120 is formed the conductive bump 160 in a subsequent process. That is to say, since the elastic member 120 is provided as a base member of the conductive bump 160, a fine pitch can be easily realized, as compared to a case where only the conductive bump exists. Stated another way, since the height of the conductive bump 160 is reduced by forming the conductive bump 160 on the elastic member 120, the diameter of the conductive bump 160 (which is substantially spherical) is also reduced allowing a fine pitch to be realized.

In addition, in order to mitigate external impacts from being transferred to the semiconductor die 110, the elastic member 120 may be made of an elastic material, e.g., having an ability to be deformed and to return to its original shape. To this end, the elastic member 120 may be made of a general elastomer, e.g., including or not including an electrically conductive filler. Further, the elastic member 120 may be a material having a high electrical conductivity, which is advantageous in view of transmission efficiency of input/output signals to/from the semiconductor die 110.

The redistribution layer 130 is formed on the semiconductor die 110. The redistribution layer 130 establishes an electric route connecting from the bond pad 111 of the semiconductor die 110 to the elastic member 120. One end of the redistribution layer 130 is formed on the bond pad 111 and the other end thereof is formed on the outer periphery of the elastic member 120 including the top surface 122 and the sidewall surface 123. In addition, the conductive bump 160 is formed on the redistribution layer 130 corresponding to the elastic member 120. Accordingly, the redistribution layer 130 adjusts formation locations of the conductive bump 160, so that the conductive bump 160 is distributed throughout the entire area of the semiconductor die 110, irrespective of the location of the bond pad 111. Therefore, the number of the conductive bump 160 to be formed on the semiconductor die 110 can be easily obtained. In order to facilitate bonding between the redistribution layer 130 and the conductive bump 160 made of a solder material, the redistribution layer 130 may be made of gold (Au), tin (Sn), lead-tin alloy (Pb—Sn alloy), nickel (Ni), palladium (Pd), or the like.

The insulating passivation layer 140, sometimes called a second passivation layer, is formed on the semiconductor die 110. The insulating passivation layer 140 is formed to surround the elastic member 120 and the redistribution layer 130. In addition, the insulating passivation layer 140 exposes at least a portion of the conductive bump 160. The insulating passivation layer 140 protects the semiconductor die 110, the elastic member 120 and the redistribution layer 130 from external impacts, and is provided for electrically insulating the semiconductor die 110, the elastic member 120 and the redistribution layer 130. In addition, since the conductive bump 160 is exposed outside the insulating passivation layer 140, it can be connected to an external circuit to input/output an electrical signal. The insulating passivation layer 140 may be made of a general epoxy flux, epoxy mold compound (EMC), or an epoxy.

The conductive bump 160 is formed on the redistribution layer 130. The conductive bump 160 may be made of a general solder material. The conductive bump 160 is formed on an upper portion of the redistribution layer 130 corresponding to the elastic member 120 and surrounds the top surface 122 and at least the top portion of the sidewall surface 123 of the elastic member 120. Accordingly, since the conductive bump 160 is derived from the elastic member 120 used as a base member, even if it is made of a loosened solder material, a fine pitch along the elastic member 120 can be easily achieved. Since the conductive bump 160 is exposed to the upper portion of the insulating passivation layer 140, they are connected to an external circuit. In addition, the conductive bump 160 is electrically connected to the bond pad 111 of the semiconductor die 110 through the redistribution layer 130.

As described above, the semiconductor device 100 according to the present embodiment of the present invention can achieve the conductive bump 160 with a fine pitch and suppress external impacts from being applied to the semiconductor die 110 by means of the elastic member 120 by providing the elastic member 120 at one side of the upper portion of the semiconductor die 110, forming the redistribution layer 130 so as to extend from the bond pad 111 of the semiconductor die 110 to the elastic member 120, and forming the conductive bump 160 over the elastic member 120.

Hereinafter, a configuration of a semiconductor device 200 according to another embodiment of the present invention will be described.

Figure 2:
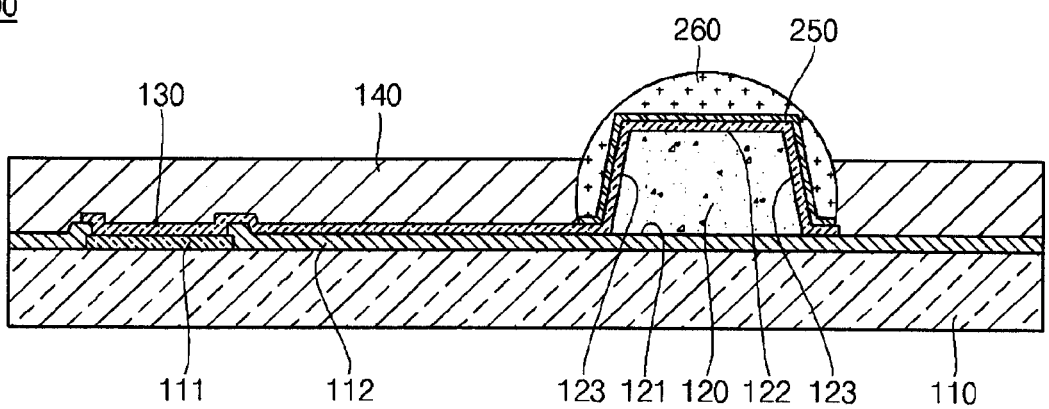
FIG. 2 is a sectional view illustrating a semiconductor device according to another embodiment of the present invention.

Referring to FIG. 2, a sectional view of a semiconductor device 200 according to another embodiment of the present invention is illustrated. Components each having the same configuration and operation for describing the previous embodiment are respectively identified by the same reference numerals, and their repetitive description will not be given. In the following, an explanation will be given in conjunction with differences between the previous and present embodiments.

As illustrated in FIG. 2, the semiconductor device 200 according to another embodiment of the present invention includes a semiconductor die 110, an elastic member 120, a redistribution layer 130, an insulating passivation layer 140, an under bump metallurgy (UBM) layer 250, and a conductive bump 260.

The UBM layer 250 is formed on the redistribution layer 130. The UBM layer 250 is formed conformally to the elastic member 120. That is to say, the UBM layer 250 is formed on an upper portion of the redistribution layer 130 corresponding to an area where the elastic member 120 is formed, i.e., the UBM layer 250 is formed on at least the top surface 122 and sidewall surface 123 of the elastic member 120. The UBM layer 250 may serve to enhance bonding strength between the redistribution layer 130 and the conductive bump 260. In addition, while the UBM layer 250 is formed as a single layer in the illustrated embodiment, it may have a multi-layered structure. The UBM layer 250 may have a structure consisting of multiple layers, for example, chrome/chrome-copper alloy/copper (Cr/Cr—Cu/Cu), titanium-tungsten alloy/copper (Ti—W/Cu), aluminum/nickel/copper (Al/Ni/Cu), nickel/gold (Ni/Au) or the like or a single layer such as nickel (Ni).

The conductive bump 260 is formed on the UBM layer 250. The conductive bump 260 is formed to surround the outer peripheries of the elastic member 120 and the UBM layer 250. The conductive bump 260 increases a contact area with the UBM layer 250 and is distributed throughout the entire surface of an upper portion of the elastic member 120 including the top surface 122 and the sidewall surface 123. In addition, the conductive bump 260 is exposed outside the insulating passivation layer 140 to then be connected to an external circuit.

As described above, the semiconductor device 200 according to the present embodiment can enhance the bonding strength of the conductive bump 260 and increase the contact areas of the conductive bump 260, thereby ultimately improving electrical properties of the conductive bump 260 by forming the UBM layer 250 on the redistribution layer 130 conformally to the elastic member 120, and forming the conductive bump 260 on the UBM layer 250.

Hereinafter, a configuration of a semiconductor device 300 according to still another embodiment of the present invention will be described.

Figure 3:
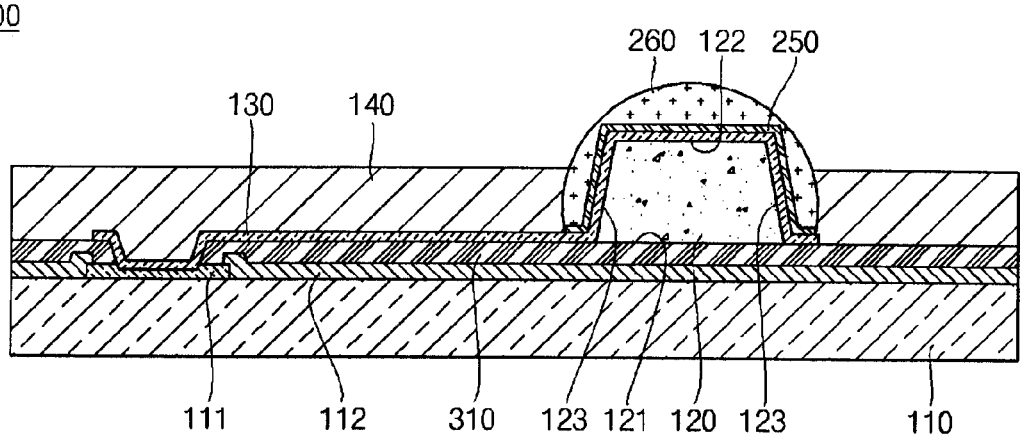
FIG. 3 is a sectional view illustrating a semiconductor device according to still another embodiment of the present invention.

Referring to FIG. 3, a sectional view illustrating a semiconductor device 300 according to still another embodiment of the present invention is illustrated.

As illustrated in FIG. 3, the semiconductor device 300 according to still another embodiment of the present invention includes a semiconductor die 110, a polyimide layer 310, an elastic member 120, a redistribution layer 130, an insulating passivation layer 140, a UBM layer 250, and conductive bump 260.

The polyimide layer 310 is formed on the semiconductor die 110. The polyimide layer 310 protects the active surface of the semiconductor die 110. In addition, the polyimide layer 310 is formed to surround areas other than the bond pad 111 of the semiconductor die 110 and to electrically insulate the same areas. Accordingly, the polyimide layer 310 insulates the redistribution layer 130 from the active surface of the semiconductor die 110 to prevent the redistribution layer 130 from being electrically disconnected and to protect the semiconductor die 110. The bottom surface 121 of the elastic member 120 and the redistribution layer 130 are formed on the polyimide layer 310 in accordance with this embodiment.

As described above, the semiconductor device 300 according to the present embodiment can achieve an operation reliability in a more ensured manner by insulating areas other than the bond pad 111 of the semiconductor die 110 by means of the polyimide layer 310, as compared to the previous embodiment.

Hereinafter, a configuration of a semiconductor device 400 according to still another embodiment of the present invention will be described.

Figure 4:
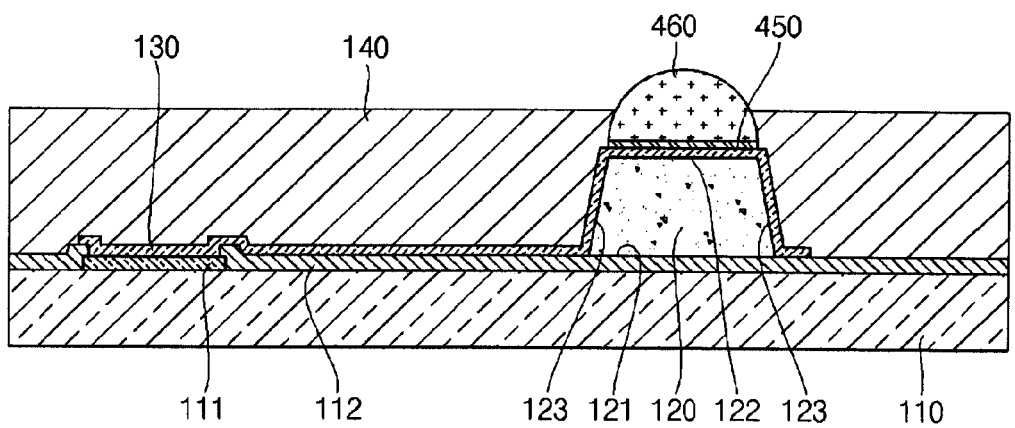
FIG. 4 is a sectional view illustrating a semiconductor device according to still another embodiment of the present invention.

Referring to FIG. 4, a sectional view illustrating a semiconductor device according to still another embodiment of the present invention is illustrated.

As illustrated in FIG. 4, the semiconductor device 400 according to still another embodiment of the present invention includes a semiconductor die 110, an elastic member 120, a redistribution layer 130, an insulating passivation layer 140, a UBM layer 450, and conductive bump 460.

The UBM layer 450 is formed on the redistribution layer 130. In addition, the UBM layer 450 is formed on the elastic member 120 only. In other words, the elastic member 120 is formed to protrude so as to have a planar top surface 122 over the semiconductor die 110 and the UBM layer 450 is formed conformally to the top surface 122 of the elastic member 120. Thus, the UBM layer 450 is formed at a height corresponding to a thickness of the elastic member 120, the thickness extending from the active surface of the semiconductor die 110. Accordingly, even though the conductive bump 460 formed on the UBM layer 450 is not so bulky, the conductive bump 460 is easily exposed to an upper portion of the insulating passivation layer 140, thereby establishing an electrical route connected to an external circuit.

The conductive bump 460 is formed on the UBM layer 450. In addition, the conductive bump 460 protrudes from the top surface 122 of the elastic member 120. The conductive bump 460 may protrude outside the insulating passivation layer 140. In addition, since the UBM layer 450 is formed only on the elastic member 120, a contact area with the conductive bump 460 is restricted. That is to say, since a sectional area of the conductive bump 460 is restricted to the top surface 122 of the elastic member 120, a fine pitch can be realized. In addition, since an amount of a material required for forming the conductive bump 460 is reduced, the manufacturing cost can be lowered.

As described above, the semiconductor device 400 according to still another embodiment of the present invention can achieve a fine pitch by forming the conductive bump 460 only on the elastic member 120 at a height corresponding to the thickness of the elastic member 120 from the active surface of the semiconductor die 110.

Hereinafter, a configuration of a semiconductor device 500 according to still another embodiment of the present invention will be described.

Figure 5:
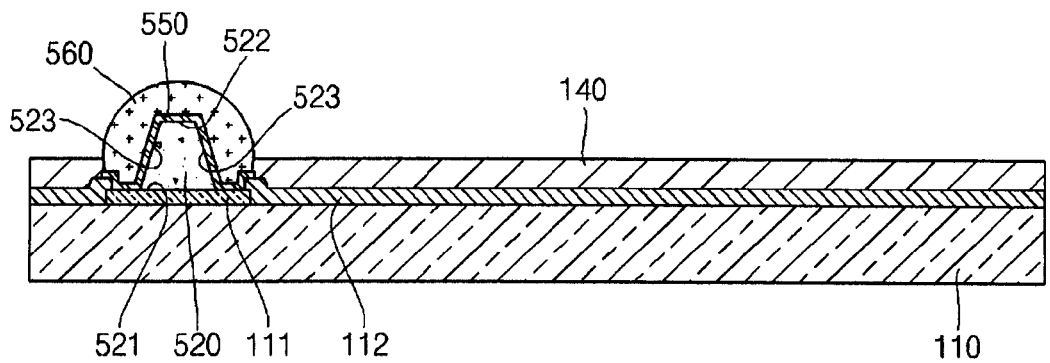
FIG. 5 is a sectional view illustrating a semiconductor device according to still another embodiment of the present invention.

Referring to FIG. 5, a sectional view illustrating a semiconductor device 500 according to still another embodiment of the present invention is illustrated.

As illustrated in FIG. 5, the semiconductor device 500 according to still another embodiment of the present invention includes a semiconductor die 110, an elastic member 520, an insulating passivation layer 140, an under bump metallurgy (UBM) layer 550, and a conductive bump 560.

The elastic member 520 is formed over the bond pad 111 of the semiconductor die 110. The elastic member 520 includes a bottom surface 521 on the bond pad 111, a top surface 522 and a sidewall surface 523 extending between the bottom surface 521 and the top surface 522. The bottom surface 521 and the top surface 522 are generally planar (flat) surfaces parallel to the active surface of the semiconductor die 110. The sidewall surface 523 tapers upwards such that area of the top surface 522 is less than the area of the bottom surface 521 although can be equal or greater in area in other examples.

The elastic member 520 may be formed substantially in the middle of the bond pad 111. In addition, the elastic member 520 has the bottom surface 521 smaller than an exposed area of the bond pad 111 and the bottom surface 521 thereof contacts the bond pad 111. Accordingly, the peripheral portion of the bond pad 111 is exposed to the outside at areas other than the bottom surface 521 of the elastic member 520 and between the elastic member 520 and the passivation layer 112.

The UBM layer 550 is formed on the top surface of the bond pad 111 and the elastic member 520 including the top surface 522 and the sidewall surface 523. The UBM layer 550 is formed at the exposed area of the bond pad 111 and in contact with the bond pad 111. Accordingly, the UBM layer 550 is electrically connected to the bond pad 111. Meanwhile, the UBM layer 550 enhances the bonding strength between the bond pad 111 and the conductive bump 560. In particular, since the top surface of the bond pad 111 is covered by the elastic member 520, a bonding area between the bond pad 111 and the conductive bump 560 is reduced. Therefore, the UBM layer 550 is provided to bond the conductive bump 560 with the top surface of the bond pad 111 in a more secured manner.

The conductive bump 560 is formed on the UBM layer 550. The conductive bump 560 is formed to entirely surround an upper portion of the UBM layer 550. Accordingly, the conductive bump 560 is positioned corresponding to an upper portion of the bond pad 111. The conductive bump 560 is exposed to an upper portion of the insulating passivation layer 140 and is connected to an external circuit to allow input/output of an electrical signal to/from the bond pad 111.

As described above, the semiconductor device 500 according to still another embodiment of the present invention may be fabricated in a simplified manner without the formation of a redistribution layer. That is to say, the semiconductor device 500 may be fabricated just by forming the elastic member 520 on the bond pad 111 and forming the conductive bump 560.

Hereinafter, a fabricating method of the semiconductor device 100 according to an embodiment of the present invention will be described.

Figure 6:
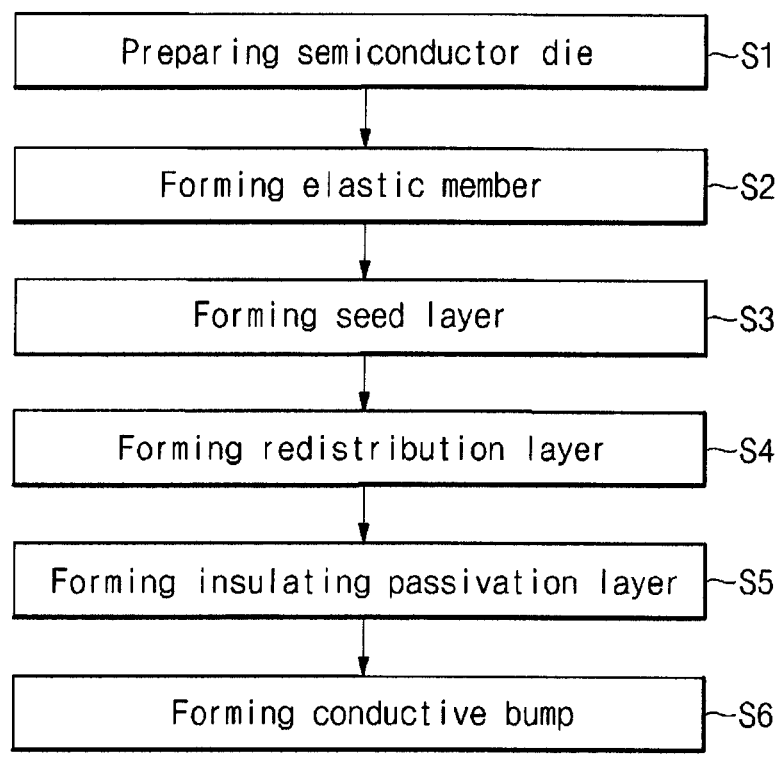
FIG. 6 is a flowchart for describing a fabricating method of a semiconductor device according to an embodiment of the present invention.

Referring to FIG. 6, a flowchart for describing a fabricating method of the semiconductor device 100 according to an embodiment of the present invention is illustrated. Referring to FIGS. 7A through 7F, sectional views of the semiconductor device 100 during fabrication are illustrated.

As illustrated in FIG. 6, the fabricating method of the semiconductor device 100 according to an embodiment of the present invention includes a preparing semiconductor die operation S1, a forming elastic member operation S2, a forming seed layer operation S3, a forming redistribution layer operation S4, a forming insulating passivation layer operation S5, and a forming conductive bump operation S6.

Figure 7A:
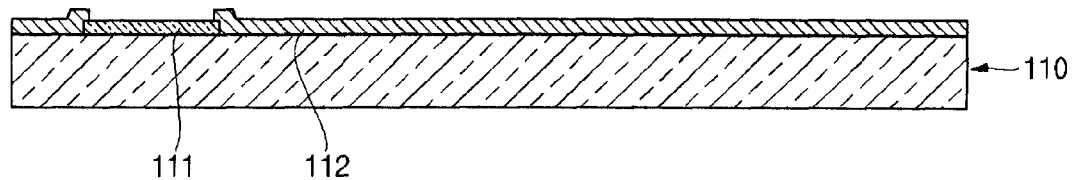
FIGS. 7A, 7B, 7C, 7D, 7E, 7F are sectional views of a semiconductor device during fabrication according to an embodiment of the present invention.

Referring to FIGS. 6 and 7A, the semiconductor die 110 is first prepared in preparing semiconductor die operation S1. The semiconductor die 110 includes a plurality of bond pads 111 on its active surface. In addition, the semiconductor die 110 includes a passivation layer 112 surrounding the rest of the areas, excluding the bond pad 111, of the semiconductor die 110.

Figure 7B:
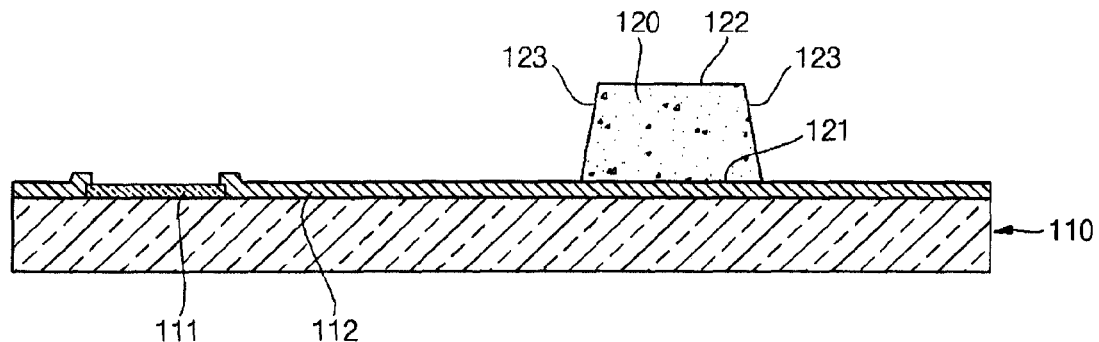

Referring to FIGS. 6 and 7B, the elastic member 120 is formed on the semiconductor die 110 in forming elastic member operation S2. The elastic member 120 is spaced apart from the bond pad 111 and is formed to protrude from an upper portion of the semiconductor die 110. In addition, the elastic member 120 may be made of a general elastic polymer, preferably a material having a high electrical conductivity. The elastic member 120 may be formed by printing a photoresist film, or curing a photoresist film in a liquid phase.

Figure 7C:
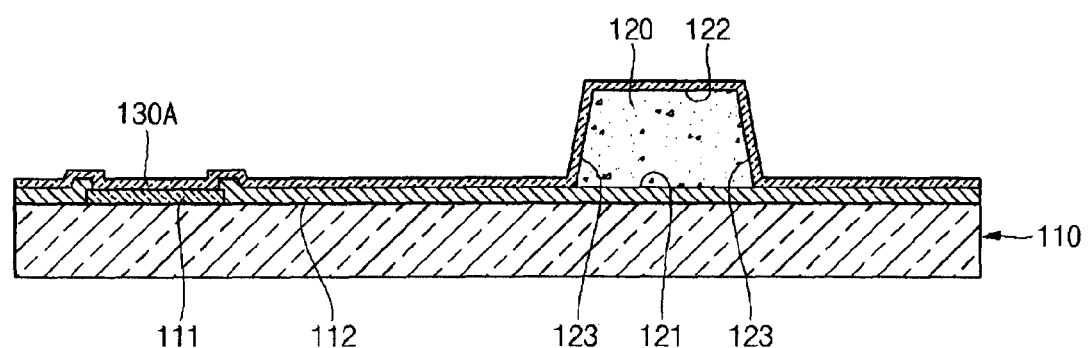

Referring to FIGS. 6 and 7C, a seed layer 130A is formed on the semiconductor die 110 in forming seed layer operation S3. The seed layer 130A is entirely formed on the active surface of the semiconductor die 110 and the elastic member 120. The seed layer 130A is electrically connected to and in contact with the bond pad 111 of the semiconductor die 110 and is formed on the outer periphery of the elastic member 120 including top surface 122 and sidewall surface 123.

Figure 7D:
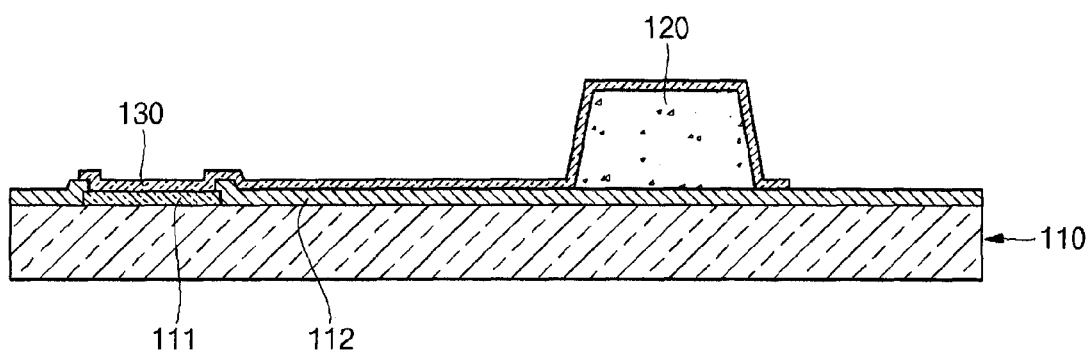

Referring to FIGS. 6 and 7D, the seed layer 130A is patterned to form a redistribution layer 130 in forming redistribution layer operation S4. The seed layer 130A may be patterned by a general photolithography process.

Figure 7E:
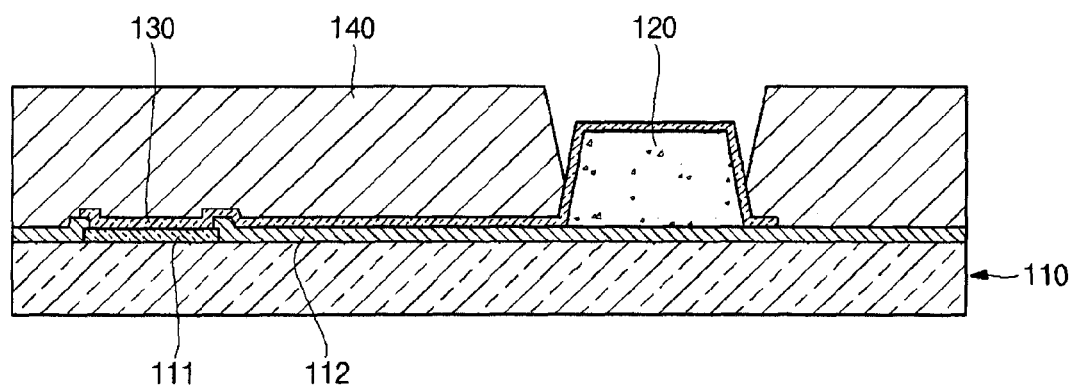

Referring to FIGS. 6 and 7E, the insulating passivation layer 140 is formed on the semiconductor die 110 in forming insulating passivation layer operation S5. The insulating passivation layer 140 is entirely formed on the active surface of the semiconductor die 110. Here, the insulating passivation layer 140 is formed to expose protrusions of the elastic member 120 and the redistribution layer 130 to the upper portion of the insulating passivation layer 140. The insulating passivation layer 140 is formed to cover the elastic member 120 and a region of the redistribution layer 130, the region excluding a portion of the redistribution layer 130 corresponding to the elastic member 120. The insulating passivation layer 140 may be made of a general epoxy flux.

Figure 7F:
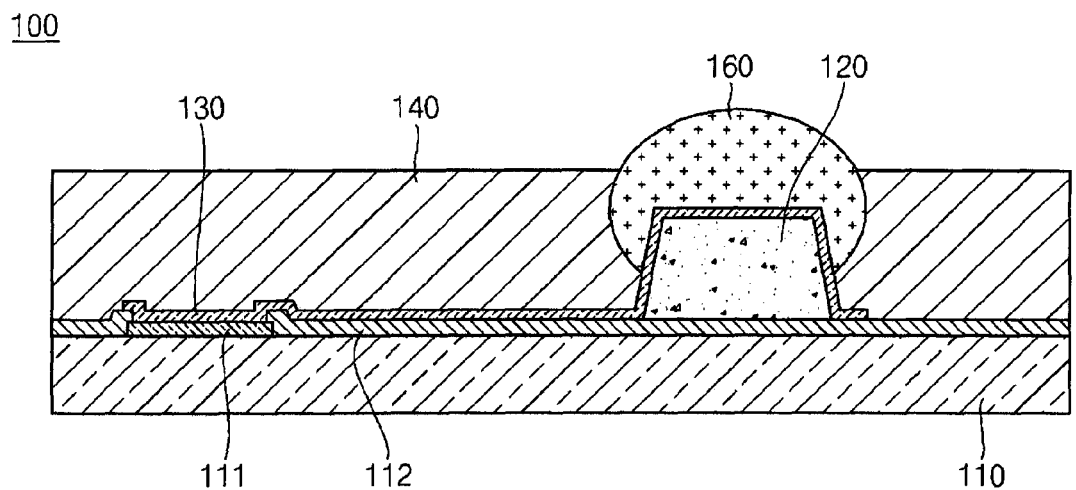

Referring to FIGS. 6 and 7F, the conductive bump 160 is formed on the redistribution layer 130 exposed through the insulating passivation layer 140 in forming conductive bump operation S6. The conductive bump 160 is formed by printing or dotting a general solder paste, followed by performing a reflow process. In addition, the conductive bump 160 is exposed to an upper portion of the insulating passivation layer 140 to be electrically connected to an external circuit.

The semiconductor device 100 according to an embodiment of the present invention may be fabricated in the above-described manner. Although not separately illustrated, the semiconductor device 200 according to another embodiment of the present invention may be fabricated by further providing the UBM layer 250. In addition, the semiconductor device 300 according to still another embodiment of the present invention may be fabricated by further providing the polyimide layer 310 on the semiconductor die 110 and performing the same fabrication processes of the previous embodiments.

Hereinafter, a fabricating method of the semiconductor device 400 according to still another embodiment of the present invention will be described.

Figure 8:
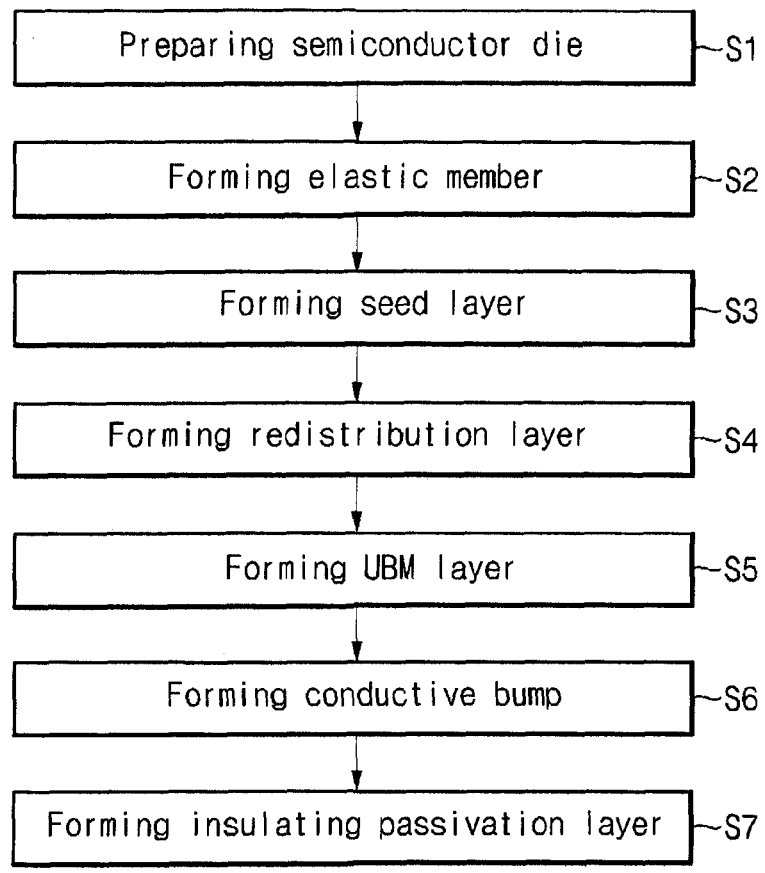
FIG. 8 is a flowchart for describing a fabricating method of a semiconductor device according to still another embodiment of the present invention.
Figure 9A:
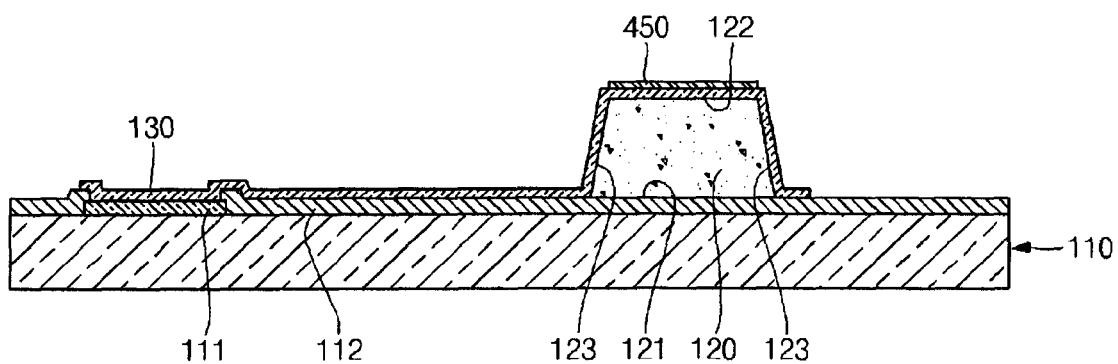
FIGS. 9A, 9B, 9C are sectional views of a semiconductor device during fabrication according to an embodiment of the present invention.
Figure 9B:
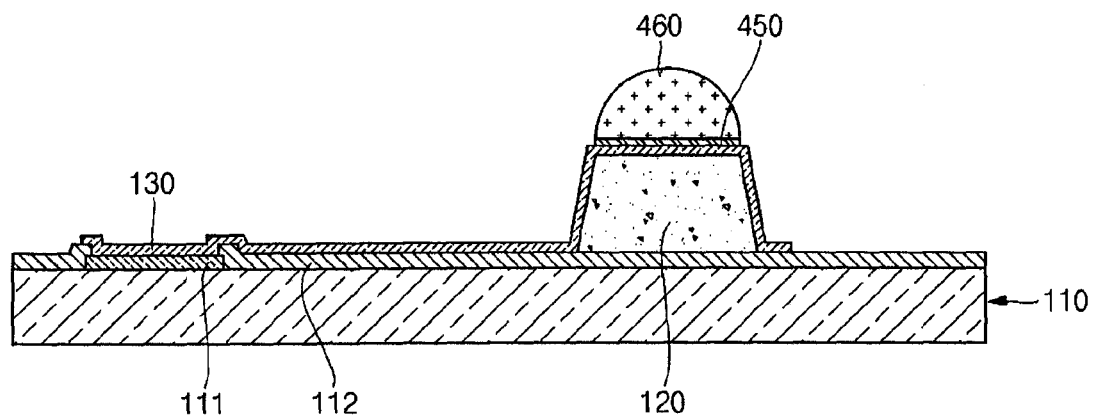
Figure 9C:
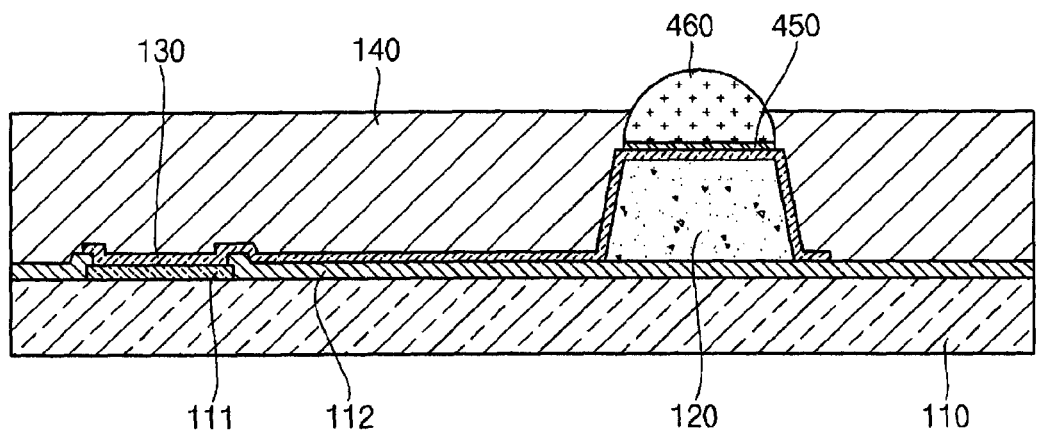

Referring to FIG. 8, a flowchart for describing a fabricating method of a semiconductor device 400 according to still another embodiment of the present invention is illustrated. Referring to FIGS. 9A through 9C, sectional views of the semiconductor device 400 during fabrication are illustrated.

As illustrated in FIG. 8, the fabricating method of the semiconductor device 400 according to still another embodiment of the present invention includes a preparing semiconductor die operation S1, a forming elastic member operation S2, a forming seed layer operation S3, a forming redistribution layer operation S4, a forming under bump metallurgy (UBM) layer operation S5, a forming conductive bump operation S6, and a forming insulating passivation layer operation S7.

The operations S1 to S4 are the same as those illustrated in FIG. 6 and a repeated description thereof will not be given.

Referring to FIGS. 8 and 9A, the UBM layer 450 is formed on the redistribution layer 130 in forming UBM layer operation S5. The UBM layer 450 is formed to correspond to the top surface 122 of the elastic member 120. The UBM layer 450 may be formed on the redistribution layer 130 by an electroless plating process or a lift-off process.

Referring to FIGS. 8 and 9B, the conductive bump 460 is formed on the UBM layer 450 in forming conductive bump operation S6. The conductive bump 460 is formed to protrude from an upper portion of the UBM layer 450. The conductive bump 460 is formed by printing or dotting a solder paste on the UBM layer 450, followed by performing a reflow process.

Referring to FIGS. 8 and 9C, the insulating passivation layer 140 is formed on the semiconductor die 110 in forming insulating passivation layer operation S7. The insulating passivation layer 140 is formed to surround the elastic member 120, the redistribution layer 130 and the UBM layer 450. In addition, the insulating passivation layer 140 surrounds a lower portion of the conductive bump 460 while exposing a top portion of the conductive bump 460.

Further, although not illustrated separately, the semiconductor device 200 according to another embodiment of the present invention may be configured such that the UBM layer 250 is entirely formed to surround an upper portion of the elastic member 120 while the conductive bump 260 is formed to surround the UBM layer 250. In addition, the semiconductor device 300 according to still another embodiment of the present invention may be configured such that the polyimide layer 310 is further provided on the semiconductor die 110. Moreover, the semiconductor device 500 according to still another embodiment of the present invention may be configured such that the elastic members 520 are formed over the plurality of bond pads 111 and the UBM layers 550 are formed without a redistribution layer.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A semiconductor device comprising:
  a semiconductor die comprising:
    an active surface comprising a bond pad;
    a first passivation layer on the active surface of the semiconductor die and having an opening therein to expose the bond pad;
  an elastic member on the active surface of the semiconductor die comprising:
    a bottom surface on the first passivation layer;
    a top surface spaced above the first passivation layer; and
    a sidewall surface extending between the bottom surface and the top surface;
  a redistribution layer covering the bond pad and the elastic member;
  a second passivation layer formed on the active surface of the semiconductor die and partially exposing the elastic member and the redistribution layer; and a conductive bump formed on the redistribution layer corresponding to the elastic member, wherein the conductive bump surrounds the top surface of the elastic member and at least the top portion of the sidewall surface of the elastic member.

2. The semiconductor device of claim 1, wherein the elastic member protrudes from the active surface of the semiconductor die.

3. The semiconductor device of claim 1, wherein the redistribution layer is formed on the bond pad, the top surface and the sidewall surface of the elastic member.

4. The semiconductor device of claim 1, wherein the conductive bump is exposed from the second passivation layer.

5. A semiconductor device comprising:
   a semiconductor die comprising:
      an active surface comprising a bond pad;
      a first passivation layer on the active surface of the semiconductor die and having an opening therein to expose the bond pad;
   an elastic member on the active surface of the semiconductor die;
   a redistribution layer covering the bond pad and the elastic member;
   a second passivation layer formed on the active surface of the semiconductor die and partially exposing the elastic member and the redistribution layer;
   a conductive bump formed on the redistribution layer corresponding to the elastic member; and
   a polyimide layer between the first passivation layer and the redistribution layer and between the first passivation layer and the elastic member.

6. The semiconductor device of claim 1, further comprising an under bump metallurgy (UBM) layer between the redistribution layer and the conductive bump.

7. The semiconductor device of claim 6, wherein the UBM layer is formed along a top surface and a sidewall surface of the elastic member.

8. A semiconductor device comprising:
   a semiconductor die comprising:
      an active surface comprising a bond pad;
      a first passivation layer on the active surface of the semiconductor die and having an opening therein to expose the bond pad;
   an elastic member formed on the bond pad;
   an under bump metallurgy (UBM) layer on the elastic member and in contact with the bond pad;
   a second passivation layer formed on the active surface of the semiconductor die and partially exposing the elastic member and the UBM layer; and
   a conductive bump formed on the UBM layer corresponding to the elastic member.

9. The semiconductor device of claim 8, wherein a bottom surface of the elastic member is smaller than the area of the bond pad.

10. The semiconductor device of claim 9, wherein a peripheral portion of the bond pad is exposed between the elastic member and the first passivation layer.

11. The semiconductor device of claim 10, wherein the UBM layer contacts the peripheral portion of the bond pad.

12. A semiconductor device comprising:
   a semiconductor die comprising a bond pad on an active surface of the semiconductor die;
   an elastic member on the active surface of the semiconductor die;
   a redistribution layer on the elastic member and the bond pad, wherein the redistribution layer is formed on a top surface and a sidewall surface of the elastic member; and
   a conductive bump on the redistribution layer corresponding to the elastic member, wherein the conductive bump surrounds the top surface and at least the top portion of the sidewall surface of the elastic member.

13. The semiconductor device of claim 12, wherein the elastic member protrudes from the active surface of the semiconductor die.

* * * * *